United States Patent
Robbe et al.

(10) Patent No.: US 7,668,278 B2
(45) Date of Patent: Feb. 23, 2010

(54) PHASE-LOCKED LOOP

(75) Inventors: Michel Robbe, Conflans Sainte Honorine (FR); Sami Aissa, Paris (FR)

(73) Assignee: Eads Secure Networks, Montigny le Bretonneaux (FR)

( * ) Notice: Subject to any disclaimer, the term of this patent is extended or adjusted under 35 U.S.C. 154(b) by 578 days.

(21) Appl. No.: 10/581,465

(22) PCT Filed: Dec. 15, 2004

(86) PCT No.: PCT/EP2004/014844

§ 371 (c)(1),
(2), (4) Date: Jun. 1, 2006

(87) PCT Pub. No.: WO2005/060104

PCT Pub. Date: Jun. 30, 2005

(65) Prior Publication Data

US 2007/0116169 A1    May 24, 2007

(30) Foreign Application Priority Data

Dec. 18, 2003 (FR) .................... 03 14921

(51) Int. Cl.
*H03D 3/24*    (2006.01)
(52) U.S. Cl. ............... 375/375; 375/376; 327/147; 327/156
(58) Field of Classification Search .......... 375/371, 375/373–376; 327/144, 147, 148, 151, 153, 327/155–157, 160, 161
See application file for complete search history.

(56) References Cited

U.S. PATENT DOCUMENTS 5,157,290 A * 10/1992 Crosby .................. 327/7
5,432,481 A     7/1995 Saito
5,631,587 A     5/1997 Co et al.
5,663,688 A *   9/1997 Delmas et al. ............ 331/14
6,026,134 A *   2/2000 Duffy et al. ............. 375/376
6,215,363 B1 *  4/2001 Conta et al. ............. 331/17
6,259,755 B1 *  7/2001 O'Sullivan et al. ........ 375/376
6,275,072 B1    8/2001 Dally et al.
6,337,891 B1    1/2002 Kim

FOREIGN PATENT DOCUMENTS

EP  0 502 631    9/1992
FR  2 736 223    1/1997

OTHER PUBLICATIONS

International Search Report, Appl. No. PCT/EP2004/014844 dated Mar. 8, 2005.

* cited by examiner

*Primary Examiner*—Dac V Ha
(74) *Attorney, Agent, or Firm*—McCracken & Frank LLP

(57) ABSTRACT

An oscillator (30) supplies a high frequency signal (S) to a frequency divider (31). A phase comparator (32) produces a signal measuring phase difference between the divided frequency signal (QA) and a reference signal. A low-pass filter (34) controls the oscillator on the basis of the measurement signal. A measurement window, of duration defined by counting cycles of the high frequency signal, is generated in response to each active edge of the divided frequency signal. The measurement signal is activated during the measurement window so that it comprises, when an active edge of the reference signal falls within the window, a first pulse between the start of the window and this edge and a second pulse, opposite to the first, between this edge and the end of the window.

11 Claims, 6 Drawing Sheets

PHASE-LOCKED LOOP

FIELD OF INVENTION

The present invention relates to phase lock loops (PLL), and in particular their application to phase or frequency modulation.

BACKGROUND OF THE INVENTION

A PLL conventionally comprises a voltage controlled oscillator (VCO) delivering a high frequency signal, a frequency divider converting the high frequency signal into a divided frequency signal, a phase comparator producing a signal measuring a phase difference between the divided frequency signal and a reference signal, and a low-pass filter to which the measurement signal is applied and the output of which controls the VCO.

In its application to modulation, instantaneous variations of the division factor applied by the frequency divider are introduced to obtain corresponding variations in the frequency or phase of the VCO output signal.

The phase comparator can be built to activate the measurement signal during a measurement window in response to each active edge of one of the input signals of the phase comparator. The activation of the measurement signal comprises, when an active edge of the other phase comparator input signal, if necessary delayed by a predefined time, falls within the measurement window, a first pulse between the start of the measurement window and this active edge and a second pulse opposite to the first pulse between the active edge and the end of the measurement window. A drift in the phase of the loop relative to its operating point is reflected in an imbalance between the two pulses, that the low-pass filter assimilates to apply a compensation to the VCO control input.

An example of such a phase comparator is described in EP-B-0 835 550. The advantage of this comparator is that it does not present what is known as a dead zone. In ordinary phase comparators, the dead zone results from the non-zero response times of the logic gates of the comparator: phase differences smaller than these response times are not detected, so the response of the comparator presents a zero slope band (dead zone) in the vicinity of the origin. Such a dead zone affects the precision of the PLL and in practical terms prevents it from being used as a phase or frequency modulator.

The phase comparator with no dead zone described in EP-B-0 835 550 has the further advantage of presenting a dual slope response around its nominal operating point, which gives it excellent sensitivity for its application to modulation.

In this comparator, the duration of the measurement window varies according to the measured phase difference, and it depends on the delays introduced by capacitive and resistive elements of the phase comparator. The result of this is the presence of noise in the output of the comparator and therefore of a phase noise in the output of the VCO.

OBJECTS OF THE INVENTION

One purpose of the present invention is to improve the performance of this type of PLL, in particular to enable high quality modulators to be produced.

SUMMARY OF THE INVENTION

The invention therefore proposes a phase lock loop, comprising a controlled oscillator to deliver a high frequency signal, a frequency divider to convert the high frequency signal into a divided frequency signal, a phase comparator to receive the divided frequency signal and a reference signal and produce a signal measuring a phase difference between the divided frequency signal and the reference signal, and a low-pass filter to control the oscillator on the basis of the measurement signal. According to the invention, the loop also comprises means for generating a measurement window, of a duration defined by counting cycles of the high frequency signal, in response to each active edge of the divided frequency signal. The phase comparator is built to activate the measurement signal during the measurement window in response to each active edge of the divided frequency signal, so that the measurement signal comprises, when an active edge of the reference signal falls within the measurement window, a first pulse between the start of the measurement window and said active edge of the reference signal and a second pulse opposite to the first pulse between said active edge of the reference signal and the end of the measurement window.

The measurement window is generated in synchronism with the high frequency synthesized signal, which minimizes the phase noise in the latter. The count of high frequency signal cycles is used to generate this window without the need of capacitive or resistive elements which are often the sources of noise. This also ensures improved robustness in respect of technological variations.

The PLL typically comprises a charge pump to inject a first current at a node of the low-pass filter in response to the first pulse of the measurement signal and to inject a second current, opposite to the first current and of the same intensity, at said node of the low-pass filter in response to the second pulse of the measurement signal. Such a charge pump can comprise two roughly identical current generators to generate the first and second currents.

The intensity of these currents is preferably digitally adjustable according to the division factor P applied by the frequency divider. This is particularly advantageous in the application to frequency or phase modulation, for which it is often desirable for the modulation spectrum to have the same shape when the carrier frequency is varied over a certain operating band. For this, the intensity of the charge pump is increased according to P, which standardizes the gain of the PLL, which is proportional to the current of the charge pump and inversely proportional to P.

The adjustable intensity of the charge pump can also be given a higher value in the frequency locking search step of the loop than in the phase tracking step executed after frequency locking. This reduces the locking time of the loop and therefore the carrier switching time in the application to modulation.

In a preferred embodiment of the invention, the charge pump comprises a switch bridge having a first path including two switches in series respectively controlled by two components of the measurement signal carrying the first and second pulses, and a second path including two other switches in series respectively controlled by the logical complements of said components of the measurement signal, said node of the low-pass filter being situated between the two switches in series of the first path.

Advantageously, the charge pump also comprises a voltage copying amplifier having an input linked to said node of the low-pass filter and an output connected to a node of the switch bridge situated between the two switches in series of the second path and a capacitive element. The recopy amplifier balances the switch bridge to avoid charging and discharging spurious capacitances when the first and second pulses are not present.

In an embodiment of the invention, the phase comparator comprises:
- a phase difference detection logic circuit receiving the divided frequency signal and the reference signal, and delivering on the one hand a first detection signal activated, after an active edge of the reference signal preceding an active edge of the divided frequency signal, during a period corresponding to the time interval between said active edges, and on the other hand a second detection signal activated, after an active edge of the divided frequency signal preceding an active edge of the reference signal, during a period corresponding to the time interval between said active edges;
- a pulse signal generator, producing a pulse signal active during the measurement window;
- means for producing a separation signal changing from a first level to a second level with a fixed delay in response to an active edge of the reference signal; and
- a charge transfer control logic circuit combining at least the detection signals, the separation signal and said pulse signal, and producing two components of the measurement signal, respectively carrying said first and second pulses, such that, while said pulse signal is active, one of the two components presents the first pulse if the separation signal is at the first level, and the other one of the two components presents the second pulse if the separation signal is at the second level.

BRIEF DESCRIPTION OF THE DRAWINGS

Other particular features and advantages of the present invention will become apparent from the description below of non-limiting embodiments, with reference to the appended drawings, in which.

DETAILED DESCRIPTION OF THE PREFERRED EMBODIMENTS

Figure 1:
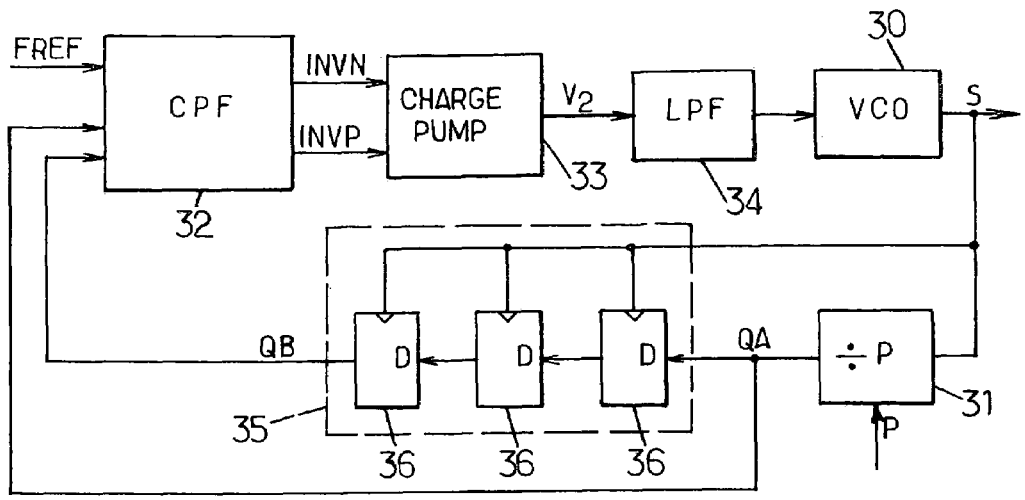
FIG. 1 is a block diagram of a PLL according to the invention.

With reference to FIG. 1, a PLL according to the invention comprises a VCO 30 delivering a radiofrequency signal S, the frequency $f_{vco}$ of which is, for example, a few hundred MHz. This signal is addressed to a frequency divider 31 applying a variable division factor P. A variation in the time of this division factor P will provide a required modulation of the output signal S.

The divided frequency signal QA from the frequency divider 31 is addressed to an input of the PFC 32 which also receives a reference signal FREF produced from a crystal oscillator. The frequency $f_{ref}$ of the signal FREF is, for example, approximately 10 MHz. To obtain a frequency $f_{vco}$ at the output of the VCO 30, P is taken to be equal to $f_{vco}/f_{ref}$. By modulating P about the value $f_{vco}/f_{ref}$, a frequency or phase modulation about a carrier at $f_{vco}$ is achieved.

In the example considered, the PFC 32 has an output signal made up of two binary components INVP, INVN. A charge pump 33 receives these two components to produce a voltage V2 at an input node of a low-pass filter 34. The filtered voltage produced by this filter 34 is used to control the frequency of the VCO 30.

As is shown in FIG. 1, the PLL according to the invention comprises a circuit 35 to produce a replica QB of the divided frequency signal QA. This replica QB reproduces each active edge of the signal QA with a delay generated from the high frequency signal S from the VCO 30.

In the example represented in FIG. 1, the circuit 35 consists of a delay line which generates QB by delaying QA by three cycles of the high frequency signal S. This delay line comprises three cascaded D flip-flops 36 clocked at the frequency $f_{vco}$ by the signal S.

The time interval between each active edge of the signal QA and the next active edge of the signal QB defines a measurement window for the PFC 32, the duration L of which is three cycles at the frequency of the VCO in the example of FIG. 1 ($L=3/f_{vco}$).

Figure 2:
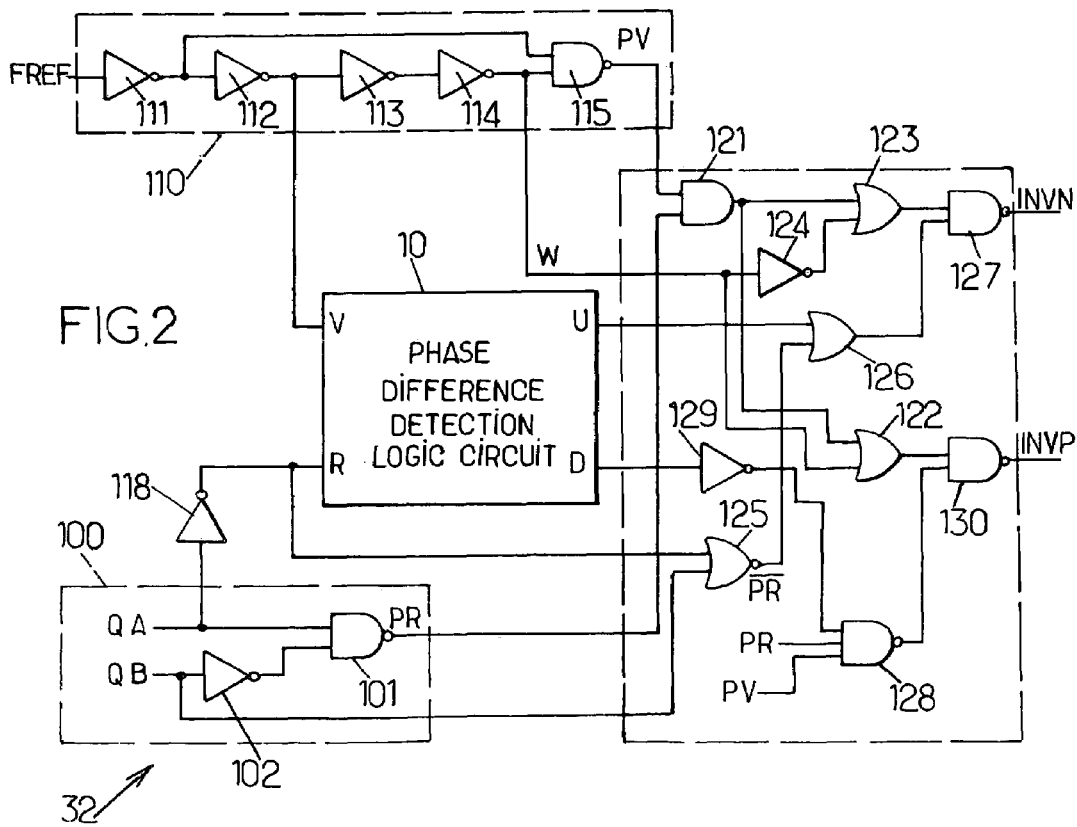
FIG. 2 is a diagram of a phase and frequency comparator (PFC) which can be used in this PLL.
Figure 4:
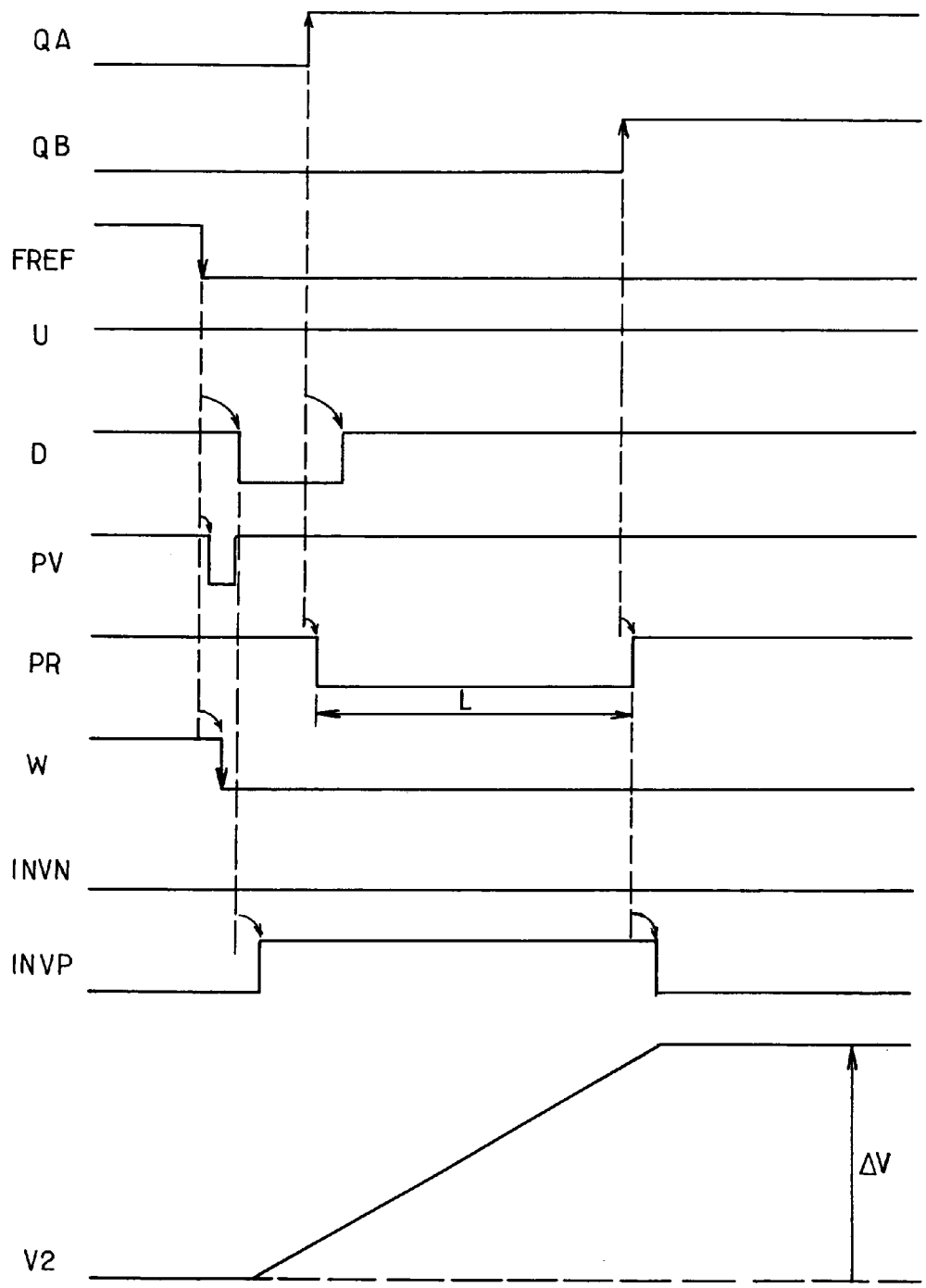
FIGS. 4 to 6 are timing diagrams illustrating the operation of the PFC.
Figure 5:
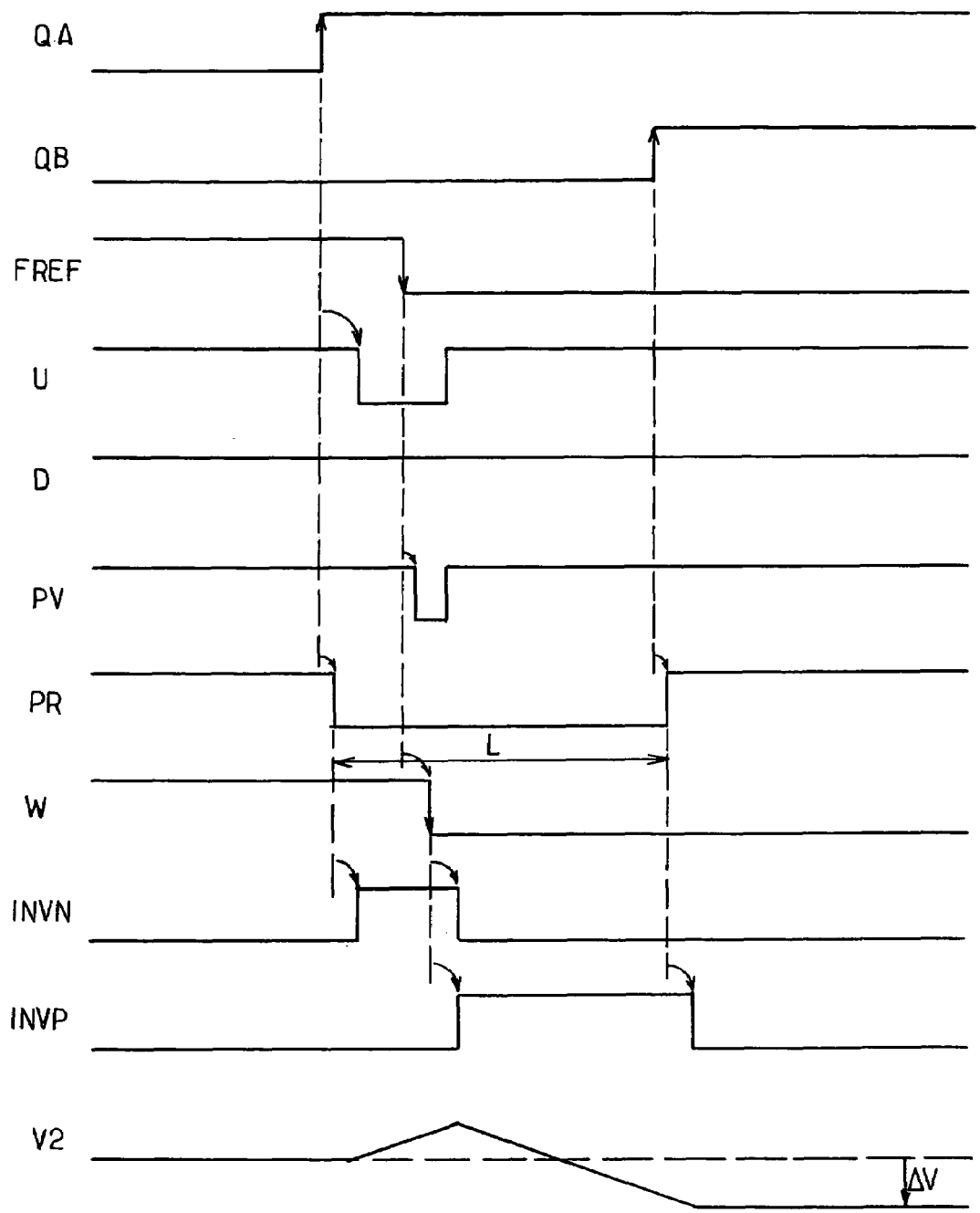
Figure 6:
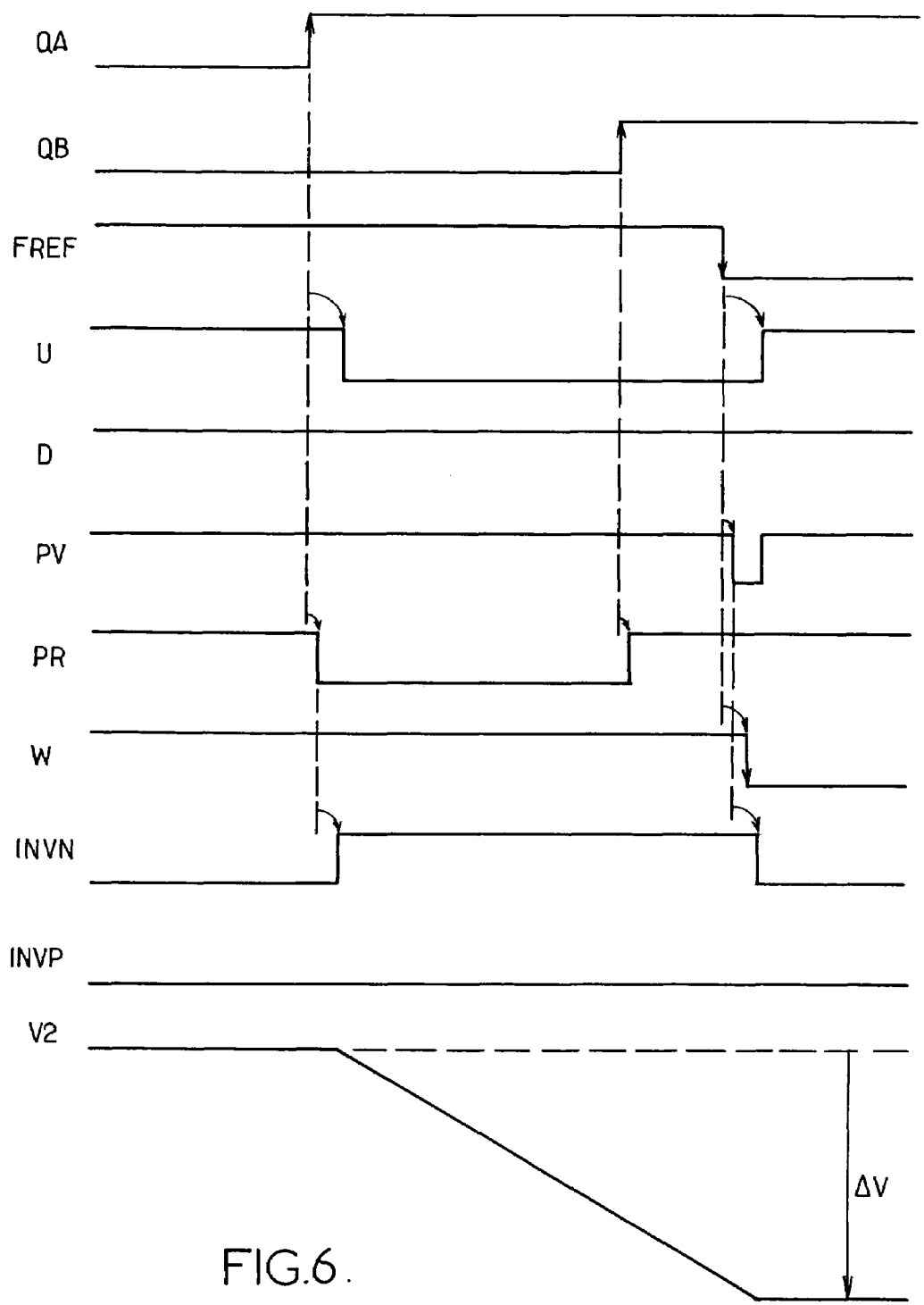

As an example, the active edges of the signals QA and QB are rising edges, between the logic 0 level and the logic 1 level. Referring to FIG. 2, the PFC 32 comprises a pulse signal generator 100 which produces a pulse signal PR activated during the measurement window on the basis of the two divided frequency signals QA, QB. The generator 100 comprises a NAND gate 101, one input of which receives the signal QA and the other input receives the logical complement of the signal QB, produced by an inverter 102. The pulse signal PR is obtained at the output of the NAND gate 101. Its pulse during the measurement window is a pulse at the logic 0 level as is shown in FIGS. 4 to 6.

The PFC of FIG. 2 comprises a second pulse signal generator 110 receiving the reference signal FREF, the active edges of which are trailing edges in the example being considered. The pulse signal PV produced by this generator 110 presents a short pulse of logic 0 level after each active edge of the reference signal FREF (see FIGS. 4 to 6). The generator 110 comprises four inverters 111-114 mounted in series, the first 111 receiving the FREF signal. The outputs of the inverters 111 and 114 are connected to the two inputs of a NAND gate 115, the output of which supplies the pulse signal PV.

To detect the phase difference between the signals QA and FREF, the PFC 32 comprises a logic circuit 10 having a first input signal V sampled at the output of the inverter 112 and a second input signal R corresponding to the logical complement of the signal QA, produced by an inverter 118.

Figure 3:
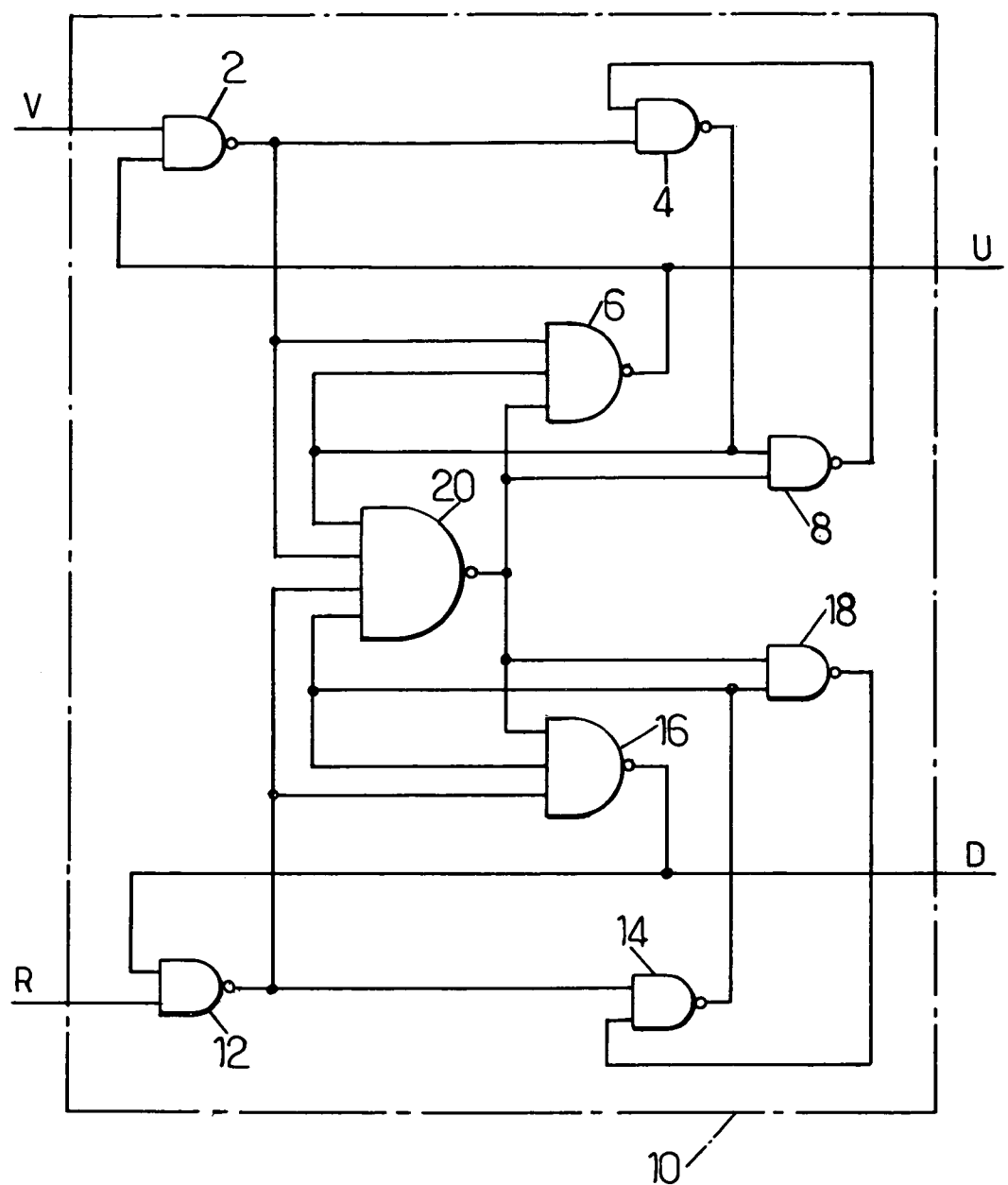
FIG. 3 is a diagram of a nine-gate comparator which can be used as the phase difference detection logic circuit in the PFC of FIG. 2.

FIG. 3 illustrates an example of phase difference detection logic circuit 10, called a nine-gate comparator, which can be used in the PFC 32. The input signals R and V are each applied to an input of a two-input NAND gate, respectively 2, 12. The output of the gate 12 is linked to an input of a two-input NAND gate 14, to an input of a three-input NAND gate 16, and to another input of the gate 20. The output of the gate 16 supplies a first detection signal D and is linked to the other input of the gate 12. The output of the gate 14 is linked to another input of the gate 16, to another input of the gate 20, and to an input of a two-input NAND gate 18. The output of the gate 20 is also linked to the last input of the gate 16 and to the other input of the gate 18. The output of the gate 18 is linked to the other input of the gate 14. The output of the gate 2 is linked to an input of a two-input NAND gate 4, to an input of a three-input NAND gate 6, and to an input of a four-input NAND gate 20. The output of the gate 6 supplies a second detection signal U and is linked to the other input of the gate 2. The output of the gate 4 is linked to another input of the gate 6, to the last input of the gate 20, and to an input of a two-input NAND gate 8. The last input of the gate 6, and the other input of the gate 8 are linked to the output of the gate 20. The other input of the gate 4 is linked to the output of the gate 8.

The PFC represented in FIG. 2 also comprises a charge transfer control logic circuit 120 which receives the two detection signals D, U, the two pulse signals PR, PV and a separation signal W which is a replica of the reference signal FREF, obtained at the output of the inverter 114.

The operations performed by the logic circuit 120 are as follows:

$$INVN=(\overline{U} \text{ AND } PR) \text{ OR } [W \text{ AND } (\overline{PR} \text{ OR } \overline{PV})]$$

$$INVP=(PR \text{ AND } PV \text{ AND } \overline{D}) \text{ OR } [\overline{W} \text{ AND } (\overline{PR} \text{ OR } \overline{PV})]$$

in which $\overline{X}$ is the logical complement of a signal X.

The charge transfer control logic circuit 120 comprises an AND gate 121 having two inputs to which are respectively addressed the pulse signals PR and PV. Two OR gates 122, 123 each have an input connected to the output of the AND gate 121. The separation signal W is addressed to the other input of the OR gate 122. The logical complement $\overline{W}$ of this separation signal, produced by an inverter 124, is addressed to the other input of the OR gate 123. A NOR gate 125 has an input receiving the signal QB and another input linked to the output of the inverter 118 to receive the logical complement of the signal QA. This NOR gate 125 produces the complement $\overline{PR}$ of the pulse signal PR, which is addressed to an input of an OR gate 126. The detection signal U is addressed to the other input of this OR gate 126. The INVN component of the measurement signal is obtained at the output of a NAND gate 127, the two inputs of which are respectively connected to the outputs of the OR gates 123 and 126. The control logic circuit 120 also comprises a NAND gate 128 having three inputs respectively receiving the pulse signals PR and PV and the logical complement of the detection signal D obtained at the output of an inverter 129. The INVP component of the measurement signal is obtained at the output of another NAND gate 130, the two inputs of which are respectively connected to the output of the OR gate 122 and to the output of the NAND gate 128.

The operation of the PFC 32 is illustrated by the timing diagrams of FIGS. 4 to 6. FIGS. 4 to 6 correspond to situations in which the PLL is not yet frequency locked, since the active edge of the reference signal FREF falls outside the measurement window defined between the consecutive active edges of the signals QA and QB.

In the case of FIG. 4, the divided frequency signal QA is delayed relative to the reference signal FREF, which gives rise to a logic 0 level pulse in the detection signal D. The start of this pulse of D activates the INVP component of the output signal. The response times of the logic gates of the PFC are such that the end of the pulse of D falls during the pulse of PR, in other words, during the measurement window. Consequently, the INVP component of the output signal remains activated until it is deactivated by the end of the pulse of PR following the rising edge of the signal QB. Within this operating band (QA delayed relative to FREF), the duration of activation of the INVP component on each cycle of frequency $f_{ref}$ increases linearly with the delay of the divided frequency signals relative to FREF, with a slope equal to 1.

In the case of FIG. 6, the delayed divided frequency signal QB is leading relative to the reference signal FREF. The rising edge of QA triggers a logic 0 level pulse in the detection signal U. The response times of the logic gates of the PFC are such that the start of the pulse of the detection signal U falls during the pulse of PR, in other words during the measurement window. The start of the pulse of PR activates the INVN component of the output signal. This INVN component remains activated until it is deactivated by the end of the pulse of U following the falling edge of the FREF signal. Within this operating band (QB leading relative to FREF), the duration of activation of the INVN component on each cycle of frequency $f_{ref}$ increases linearly with the delay (negative) of the divided frequency signals relative to FREF, with a slope equal to −1.

In the case of FIG. 5, the active edge of the reference signal FREF falls during the measurement window, between the active edges of the two divided frequency signals QA, QB. As in the case of FIG. 6, the start of the pulse of PR activates the INVN component of the output signal. This activation of INVN lasts until the logic circuit 120 responds to the falling edge of the separation signal W following that of the FREF signal. At this moment, the logic circuit 120 triggers an active edge of the other INVP component of the output signal. This activation of INVP lasts until it is deactivated by the end of the pulse of PR following the rising edge of the signal QB, as in the case of FIG. 4.

The difference between the respective activation durations of the INVP and INVN components of the output signal of the PFC 32 is a piecewise roughly linear increasing function of the time offset between the divided frequency signal QA and the reference signal FREF. The slope of this function is equal to 2 in the band in which the active edge of the reference signal FREF falls during the measurement window, and 1 outside this band (PLL not frequency locked). The above-mentioned response times of the logic gates of the PFC are such that the PFC does not present a dead zone. It should be noted that this property is obtained without the use of resistive or capacitive elements in the PFC.

The role of the charge pump 33 is to generate a positive current when INVP is active, and a negative current when INVN is active. The total charge generated will thus be a piecewise roughly linear increasing function of the time offset between the divided frequency signal QA and the reference signal FREE. Accumulated in a capacitor, this charge is translated into a voltage that can be used to control the VCO 30 to force phase alignment between QA and FREF. In practice, a low-pass filter 34 is inserted between the charge pump 33 and the VCO 30 to eliminate high frequency fluctuations due in particular to switching of the INVP and INVN components.

Figure 7:
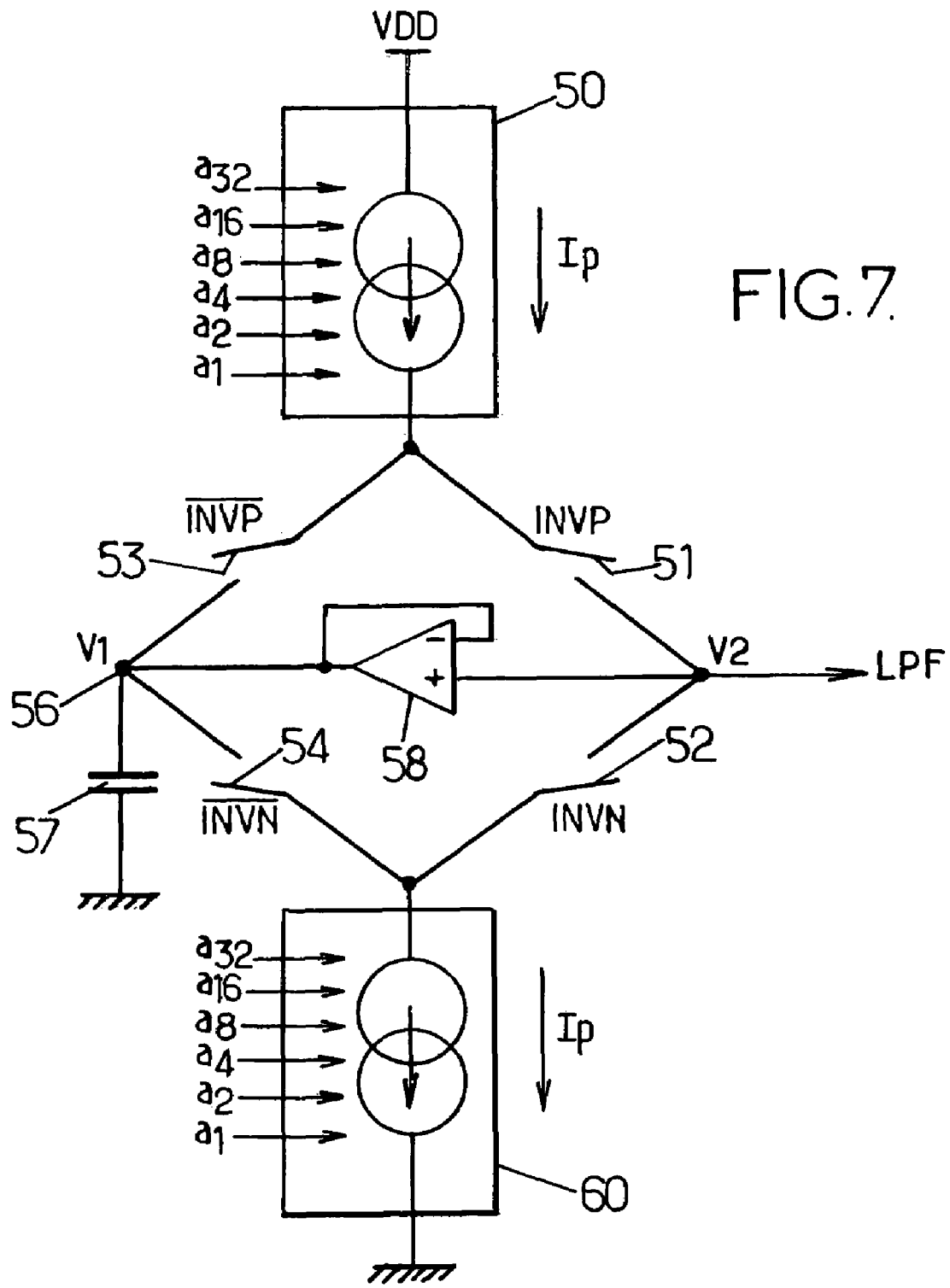
FIG. 7 is a diagram of a charge pump which can be used in the PLL of FIG. 1.

A preferred embodiment of the charge pump 33 is illustrated by FIG. 7. Two identical generators 50, 60, delivering a current of intensity $I_P$, are connected either side of a switch bridge 51-54, the positive current generator 50 being also connected to the positive terminal of a voltage power supply, and the negative current generator 50 being also connected to the ground terminal of the voltage power supply. The current generators 50, 60 preferably have a cascaded structure to minimize the memory effects and current spikes that would adversely effect the linearity required for the modulation application.

The switches 51 and 52 are respectively controlled by the INVP and INVN components of the output signal of the PFC 32, such that they are closed when INVP and INVN are at the logic level 1. They are connected in series between the two current generators 50, 60 along a first path of the bridge. The node 55 situated between these two switches 51, 52, the voltage of which is designated V2, is an input node of the low-pass filter 34. The switches 53 and 54 are respectively controlled by the INVP and INVN components of the output signal of the PFC 32, such that they are open when INVP and INVN are at the logic level 1. They are connected in series between the two current generators 50, 60 along a second path of the bridge. The node 56 situated between these two switches 53, 54, the voltage of which is designated V1, is linked to ground via a smoothing capacitor 57, the capacitance of which is typically around 500 pF.

The bottom parts of FIGS. 4 to 6 show the trend of the voltage V2 according to the pulses presented by the IVNP, INVN components of the output signal of the PFC 32.

Preferably, the current delivered by the generators 50, 60 has a digitally adjustable intensity $I_P$. In the example illustrated by FIG. 7, they are controlled on six bits $a_1$, $a_2$, $a_4$, $a_8$, $a_{16}$, $a_{32}$. A controller, not represented, of the PLL drives these six bits according to, in particular:

the value of the carrier frequency to be modulated within the operating band of the PLL, in other words the division factor P applied by the frequency divider. The gain of the PLL is proportional to the gain of the VCO 30, the gain of the PFC 32 and the intensity $I_P$ of the charge pump 33, and inversely proportional to P. Since P increases proportionally with the carrier frequency, the controller varies $I_P$ in the same direction to ensure that the spectral form of the modulated signal is uniform when the carrier varies;

the frequency locked or non-locked state of the PLL. It is advantageous to take $I_P$ to be higher before frequency locking to speed up the locking process. This in particular minimizes the switching time of the modulator between two carrier frequencies. The controller can simply determine that the PLL is frequency locked by the fact that the active edge of the reference signal FREF falls a number of times in succession within the measurement window.

A fast operational amplifier 58, mounted as a follower amplifier, is connected between the nodes 55, 56 of the charge pump 33 to align the value of the voltage V1 on that of the voltage V2. The negative input and the output of this amplifier 58 are connected to the node 56, whereas its positive input is connected to the node 55.

This recopy amplifier 58 is used to restore the switch bridge associated with the capacitor 57 to equilibrium, which is particularly useful when the comparison frequency $f_{ref}$ is relatively high. The recopy amplifier 58 advantageously presents a transitional response with the critical Butterworth filter damping. It is used to cancel the voltage difference between the nodes 55 and 56 to significantly reduce the current spikes at the switching times of the bridge 51-54.

It will be noted that numerous variants can be applied to the embodiment of the invention described above, in particular with respect to the logical structure of the phase comparator or the way of producing the two offset versions QA, QB of the divided frequency signal. The number of cycles of the frequency $f_{vco}$ used to define the duration of the measurement window is not necessarily a constant number from one comparison cycle to the next. The offset signal QB can be generated jointly with QA by the frequency divider 31.

The invention claimed is:

1. Phase lock loop, comprising a controlled oscillator to deliver a high frequency signal, a frequency divider to convert the high frequency signal into a divided frequency signal, a phase comparator to receive the divided frequency signal and a reference signal and produce a signal measuring a phase difference between the divided frequency signal and the reference signal, and a low-pass filter to control the oscillator on the basis of the measurement signal, wherein it also comprises means for generating a measurement window, of a duration defined by counting cycles of the high frequency signal, in response to each active edge of the divided frequency signal, and the phase comparator is built to activate the measurement signal during the measurement window in response to each active edge of the divided frequency signal, so that the measurement signal comprises, when an active edge of the reference signal falls within the measurement window, a first pulse between the start of the measurement window and said active edge of the reference signal and a second pulse opposite to the first pulse between said active edge of the reference signal and the end of the measurement window;

wherein the phase comparator is designed to produce the measurement signal in the form of two components, each having a respective activation duration, the difference between said activation durations of the components being a piecewise linear function of a time offset between the divided frequency signal and the reference signal.

2. Phase lock loop according to claim 1, wherein the means for generating the measurement window comprise means of producing a replica of the divided frequency signal, reproducing each active edge of the divided frequency signal with a delay generated from the high frequency signal.

3. Phase look loop according to claim 1, wherein the duration of the measurement window is a whole number of cycles of the high frequency signal.

4. Phase look mop according to claim 1, comprising a charge pump to inject a first current at a node of the low-pass filter in response to the first pulse of the measurement signal and to inject a second current, opposite to the first current and of the same intensity, at said node of the low-pass filter in response to the second pulse of the measurement signal.

5. Phase lock loop according to claim 4, wherein the charge pump comprises two substantially identical current generators to generate the first and second currents.

6. Phase lock loop according to claim 5, wherein the two current generators produce a digitally adjustable current intensity.

7. Phase lock loop according to claim 6, comprising means for varying said adjustable intensity according to a division factor applied by the frequency divider.

8. Phase lock loop according to claim 6, comprising means for giving said adjustable intensity a higher value in a frequency locking search step of the loop than in a phase tracking step executed after frequency locking.

9. Phase lock loop according to claim 8, wherein the charge pump also comprises a recopy amplifier having an input linked to said node of the low-pass filter and an output connected to a node of the switch bridge situated between the two switches in series of the second path and to a capacitive element.

10. Phase lock loop according to claim 4, wherein the charge pump comprises a switch bridge having a first path including two switches in series respectively controlled by two components of the measurement signal carrying the first and second pulses, and a second path including two other switches in series respectively controlled by the logical complements of said components of the measurement signal, said node of the low-pass filter being situated between the two switches in series of the first path.

11. Phase lock loop according to claim 1, in which the phase comparator comprises:

a phase difference detection logic circuit receiving the divided frequency signal and the reference signal, and delivering on the one band a first detection signal activated, after an active edge of the reference signal preceding an active edge of the divided frequency signal, during a period corresponding to the time interval between said active edges, and on the other hand a second detection signal activated, after an active edge of the divided frequency signal preceding an active edge of the reference signal, during a period corresponding to the time interval between said active edges;

a pulse signal generator, producing a pulse signal active during the measurement window;

means for producing a separation signal changing from a first level to a second level with a fixed delay in response to an active edge of the reference signal; and a charge transfer control logic circuit combining at least the detection signals, the separation signal and said pulse signal, and producing two components of the measurement signal, respectively carrying said first and second pulses, such that, while said pulse signal is active, one of the two components presents the first pulse if the separation signal is at the first level, and the other one of the two components presents the second pulse if the separation signal is at the second level.

* * * * *